United States Patent
Cho et al.

(10) Patent No.: US 10,069,012 B2
(45) Date of Patent: Sep. 4, 2018

(54) PIXEL ARRAY SUBSTRATE

(71) Applicant: Au Optronics Corporation, Hsinchu (TW)

(72) Inventors: Wei-Min Cho, Taoyuan (TW); Yu-Sheng Huang, Kaohsiung (TW); Chia-Wei Chen, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/397,710

(22) Filed: Jan. 3, 2017

(65) Prior Publication Data
US 2017/0194505 A1 Jul. 6, 2017

(30) Foreign Application Priority Data
Jan. 4, 2016 (TW) .............................. 105100095 A

(51) Int. Cl.
| | | |
|---|---|---|
| G11C 19/28 | (2006.01) | |
| H01L 29/786 | (2006.01) | |
| H01L 27/12 | (2006.01) | |
| G09G 3/36 | (2006.01) | |

(52) U.S. Cl.
CPC ........ *H01L 29/78609* (2013.01); *G11C 19/28* (2013.01); *H01L 27/124* (2013.01); *H01L 27/1251* (2013.01); *G09G 3/3648* (2013.01); *G09G 2300/0408* (2013.01); *G09G 2300/0426* (2013.01)

(58) Field of Classification Search
CPC ............... H01L 27/124; H01L 27/3267; H01L 27/1251; G11C 19/28; G02F 2001/133342
See application file for complete search history.

(56) References Cited

U.S. PATENT DOCUMENTS

| | | | |
|---|---|---|---|
| 8,884,290 B2 | 11/2014 | Oh et al. | |
| 9,291,863 B2 | 3/2016 | Onogi et al. | |
| 9,360,726 B2 | 6/2016 | Takizawa et al. | |
| 2008/0024416 A1 | 1/2008 | Onogi et al. | |
| 2008/0272375 A1* | 11/2008 | Oh ..................... | G02F 1/13471 257/72 |
| 2009/0268145 A1 | 10/2009 | Anjo et al. | |
| 2012/0313845 A1 | 12/2012 | Onogi et al. | |
| 2015/0021081 A1 | 1/2015 | Mitarai et al. | |

(Continued)

FOREIGN PATENT DOCUMENTS

| | | |
|---|---|---|
| CN | 203012296 | 6/2013 |
| JP | 2010272706 | 12/2010 |

(Continued)

*Primary Examiner* — Marcos D Pizarro
*Assistant Examiner* — Antonio Crite
(74) *Attorney, Agent, or Firm* — JCIPRNET

(57) ABSTRACT

A pixel array substrate including a substrate having at least one via, at least one conductor disposed in the at least one via, pixel units, scan lines electrically connected to the pixel units, at least one shift register and at least one bus line is provided. The pixel units, the scan lines and the at least one shift register are disposed on a first surface of the substrate. The at least one shift register is used to transmit a first gate signal to the corresponding scan lines. The at least one bus line is disposed on a second surface of the substrate. The at least one bus line is electrically connected to the at least one shift register by the at least one conductor.

10 Claims, 6 Drawing Sheets

(56) References Cited

U.S. PATENT DOCUMENTS

| | | | |
|---|---|---|---|
| 2015/0029433 A1 | 1/2015 | Takizawa et al. | |
| 2015/0295015 A1* | 10/2015 | Yu .................. | H01L 27/3251 |
| | | | 257/88 |
| 2016/0231628 A1 | 8/2016 | Onogi et al. | |
| 2016/0266453 A1 | 9/2016 | Onogi et al. | |

FOREIGN PATENT DOCUMENTS

| | | |
|---|---|---|
| TW | 200807122 | 2/2008 |
| TW | 201337421 | 9/2013 |
| WO | 2014059603 | 4/2014 |

\* cited by examiner

PIXEL ARRAY SUBSTRATE

CROSS-REFERENCE TO RELATED APPLICATION

This application claims the priority benefit of Taiwan application serial no. 105100095, filed on Jan. 4, 2016. The entirety of the above-mentioned patent application is hereby incorporated by reference herein and made a part of this specification.

BACKGROUND OF THE DISCLOSURE

Field of the Disclosure

The disclosure relates to an active device substrate, and more particularly to a pixel array substrate.

Description of Related Art

In recent years, as environmental awareness has increased, flat display panels having advantages such as low power consumption, optimal space utilization and so on have become the mainstream of the market. However, with development of display technology, users not only demand the above characteristics, but also turn their attention to exterior beauty of the display panels. More specifically, in addition to the advantages such as low power consumption, optimal space utilization and so on, the display panels more desirably have a large display area and a slim border, so as to realize simple and elegant displays.

To realize a slim border display panel, a proposal has been made in which during formation of a pixel structure, a gate driving circuit, commonly known as a gate driver on array (GOA) circuit in this field, is also formed in a peripheral area of a substrate, so as to replace a gate driver IC that occupies large area, thereby reducing a border width of the display panel. However, in a conventional GOA circuit, bus lines of the GOA circuit occupy 40% or more of the whole width of the GOA circuit, which is not favorable for further reducing the border width. In addition, in order to allow more lines to be arranged in the limited area, a connection line of the GOA circuit tends to cross over the bus line so as to be coupled with the bus line to form a parasitic capacitance, which increases loading of the GOA circuit.

SUMMARY OF THE DISCLOSURE

The disclosure provides a pixel array substrate, and a display panel that adopts the pixel array substrate easily realizes a slim border.

The disclosure provides a pixel array substrate, the pixel array substrate including a substrate, at least one conductor, a plurality of pixel units, a plurality of data lines, a plurality of scan lines, at least one shift register and at least one bus line. The substrate has a first surface, a second surface and at least one via. The first surface is opposite the second surface. The at least one via penetrates the first surface and the second surface. The at least one conductor is disposed in the at least one via. The pixel units are disposed on the first surface. Each pixel unit includes an active device and a pixel electrode. The active device has a gate, a channel disposed overlapping the gate, and a source and a drain respectively electrically connected to both sides of the channel. The pixel electrode is electrically connected to the drain. The data lines are disposed on the first surface, and the pixel units are electrically connected to one of the corresponding data lines. The scan lines are disposed on the first surface, and the pixel units are electrically connected to one of the corresponding scan lines. The at least one shift register is located on the first surface and configured to transmit a first gate signal to the corresponding scan lines. The at least one bus line is electrically connected to the at least one shift register by the at least one conductor.

The disclosure provides another pixel array substrate, the pixel array substrate including a substrate, at least one conductor, a plurality of pixel units, a plurality of data lines, a plurality of scan lines, a first shift register and a second shift register. The substrate has a first surface, a second surface and at least one via. The first surface is opposite the second surface. The at least one via penetrates the first surface and the second surface. The at least one conductor is disposed in the at least one via. The pixel units are disposed in a display area and on the first surface. Each pixel unit includes an active device and a pixel electrode. The active device has a gate, a channel disposed overlapping the gate, and a source and a drain respectively electrically connected to both sides of the channel. The pixel electrode is electrically connected to the drain. The gate, the channel, the source, the drain and the pixel electrode are located on the same side of the substrate. The data lines are disposed on the first surface, and the pixel units are electrically connected to one of the corresponding data lines. The scan lines are disposed on the first surface, and the pixel units are electrically connected to one of the corresponding scan lines. The first shift register is located on the first surface and configured to transmit a first gate signal to the corresponding scan lines. The second shift register is located on the second surface and configured to transmit a second gate signal to the corresponding scan lines. The first shift register and the second shift register respectively have a first transistor and a second transistor. The first transistor includes a first gate disposed on the first surface, a first gate insulation layer disposed on the first gate, a first channel disposed on the first gate insulation layer, and a first source and a first drain disposed on the first channel. The second transistor includes a second gate disposed on the second surface, a second gate insulation layer disposed on the second gate, a second channel disposed on the second gate insulation layer, and a second source and a second drain disposed on the second channel. The second channel is located between the second surface of the substrate and the second gate.

According to an embodiment of the disclosure, the at least one conductor is a plurality of conductors. The at least one shift register further includes a first shift register located on the first surface and a second shift register located on the second surface. The first shift register is electrically connected to the second shift register by one of the conductors. The first shift register and the second shift register overlap in a normal direction. The scan lines include a plurality of first scan lines and a plurality of second scan lines. The first scan lines are electrically connected to the first shift register and configured to receive the first gate signal provided by the first shift register. The second scan lines are electrically connected to the second shift register and configured to receive the second gate signal provided by the second shift register. The first scan lines and the second scan lines are arranged alternately.

According to an embodiment of the disclosure, the second shift register is electrically connected to the second scan lines by one of the conductors.

According to an embodiment of the disclosure, the at least one bus line further includes a plurality of first bus lines and a plurality of second bus lines. The first bus lines are located on the first surface and electrically connected to the first scan lines by the first shift register. The second bus lines are located on the second surface and electrically connected to the second scan lines by the second shift register. The first bus lines and the second bus lines are aligned or staggered in the normal direction.

According to an embodiment of the disclosure, the first shift register and the second shift register respectively have a first transistor and a second transistor. The second transistor is electrically connected to the first transistor by one of the conductors. The first transistor includes a first gate, a first gate insulation layer, a first channel, a first source and a first drain. The first gate insulation layer is disposed between the first gate and the first channel, and the first source and the first drain is contact the first channel. The first source or the first drain is electrically connected to the corresponding at least one bus line.

According to an embodiment of the disclosure, the second transistor includes a second channel, a second source, a second drain, a second gate insulation layer and a second gate. The second gate insulation layer is disposed between the second gate and the second channel, and the second source and the second drain is contact the first channel. The first transistor is disposed on the first surface of the substrate, and the second transistor is disposed on the second surface of the substrate. The second source or the second drain is electrically connected to the corresponding bus line.

According to an embodiment of the disclosure, the first gate is located between the first channel and the first surface of the substrate.

According to an embodiment of the disclosure, the second gate is located between the second channel and the second surface of the substrate.

Based on the above, in the pixel array substrate according to an embodiment of the disclosure, at least a part of the bus lines are located on the second surface of the substrate. The bus lines are electrically connected to the corresponding shift registers by the conductor that passes through the first surface and the second surface of the substrate. In other words, by use of the conductor, some components of the pixel array substrate may be disposed on the first surface of the substrate while other components of the pixel array substrate may be disposed on the second surface of the substrate. In this way, the width of a peripheral area of the pixel array substrate is reduced, which contributes to realization of an ultra-slim border in a display panel that adopts the pixel array substrate.

To make the above features and advantages of the disclosure more comprehensible, embodiments accompanied with drawings are described in detail as follows.

DETAILED DESCRIPTION OF DISCLOSED EMBODIMENTS

Figure 1:
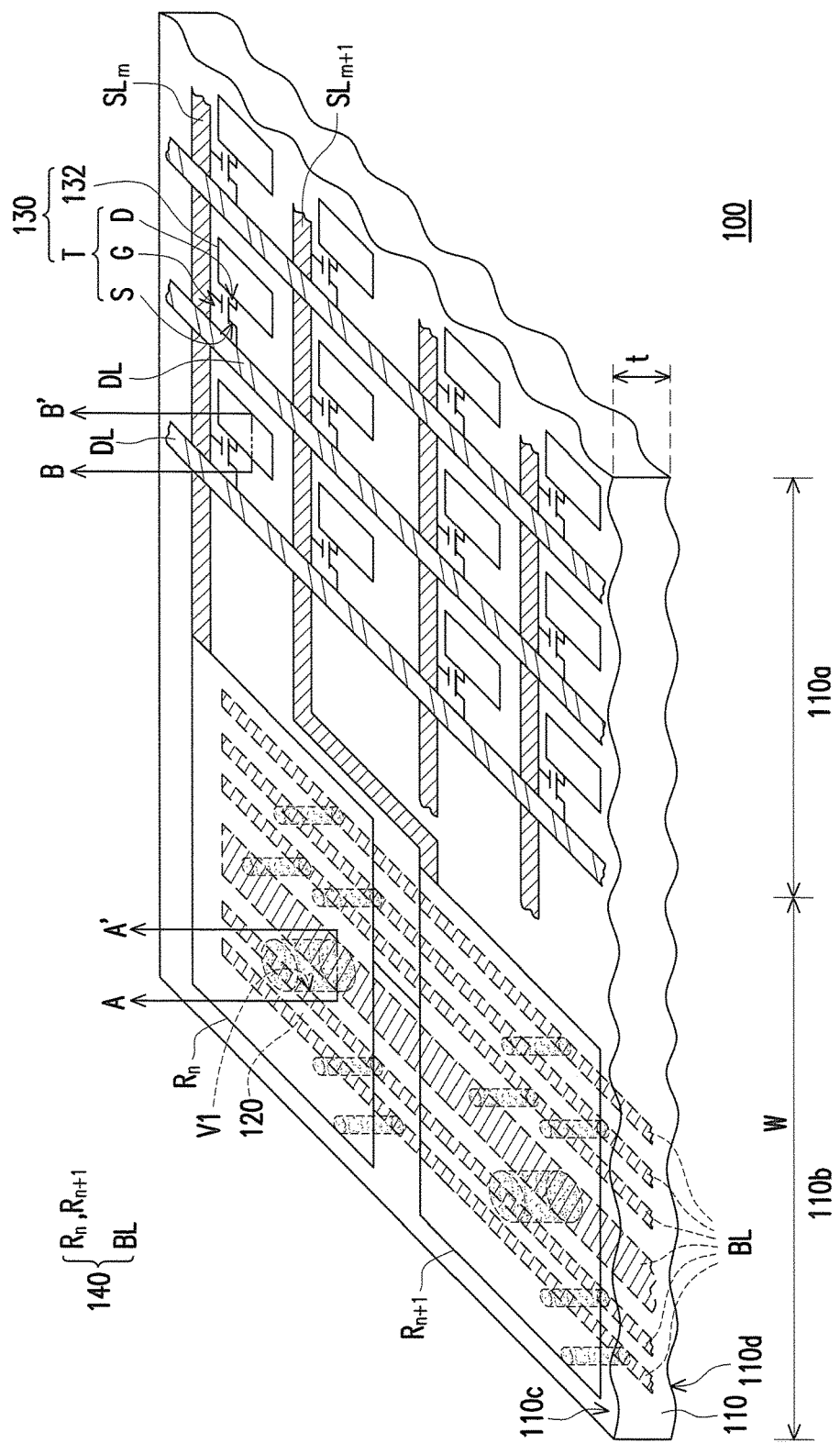
FIG. 1 is a schematic three-dimensional view of a pixel array substrate according to an embodiment of the disclosure.
Figure 2:
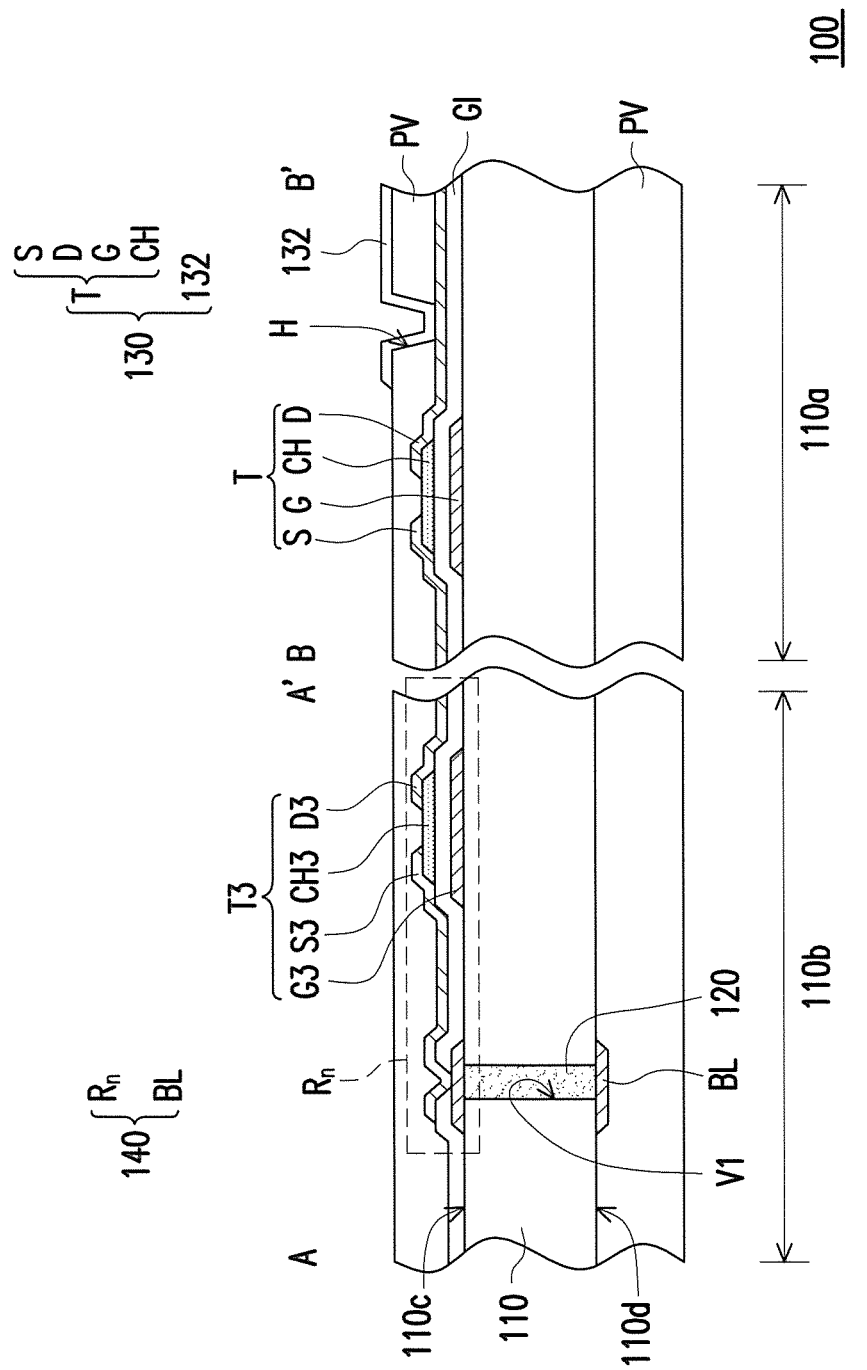
FIG. 2 is a schematic cross-sectional view of a pixel array substrate according to an embodiment of the disclosure.

FIG. 1 is a schematic three-dimensional view of a pixel array substrate according to an embodiment of the disclosure. FIG. 2 is a schematic cross-sectional view of a pixel array substrate according to an embodiment of the disclosure. Particularly, FIG. 2 corresponds to section lines A-A' and B-B' in FIG. 1. Referring to FIG. 1, a pixel array substrate 100 includes a substrate 110, at least one conductor 120, a plurality of pixel units 130, a plurality of data lines DL, a plurality of scan lines $SL_m$ and $SL_{m+1}$, and a scan driving circuit 140. The substrate 110 has a display area 110a, a peripheral area 110b outside the display area 110a, a first surface 110c, and a second surface 110d opposite the first surface 110c. At least one via V1 penetrating the first surface 110c and the second surface 110d is disposed in the peripheral area 110b of the substrate 110. In the present embodiment, the via V1 is formed by machining (e.g., glass drilling techniques). The via V1 is a so-called through glass via (TGV). However, the invention is not limited thereto. In other embodiments, the via V1 may be formed by laser ablation, etching techniques or other suitable methods. The substrate 110 is, e.g., a transparent substrate. The transparent substrate is made of glass or any other applicable material. However, the invention is not limited thereto. In other embodiments, the substrate 110 may be a non-transparent/reflective substrate. The non-transparent/reflective substrate is made of a conductive material, a wafer, a ceramic or any other suitable material.

The at least one conductor 120 is disposed in the at least one via V1. More specifically, the conductor 120 is composed of a conductive material that fills the via V1. In the present embodiment, the conductor 120 is made of metal (e.g., copper). However, the invention is not limited thereto. The via V1 is, e.g., a cylindrical hole, and the conductor 120 is, e.g., a conductive cylinder that fills the cylindrical hole. However, the invention is not limited thereto. The shape of both the via V1 and the conductor 120 may be designed in other suitable ways depending on actual needs.

Referring to FIG. 1, the pixel units 130 are disposed in the display area 110a of the substrate 110 and on the first surface 110c of the substrate 110. Each pixel unit 130 includes an active device T and a pixel electrode 132 electrically connected to the active device T. Referring to FIGS. 1 and 2, the active device T has a gate G, a channel CH (denoted in FIG. 2) disposed overlapping the gate G, and a source S and a drain D respectively electrically connected to both sides of the channel CH. A gate insulation layer GI is disposed between the gate G and the channel CH. The pixel electrode 132 is filled in a hole H of an insulation layer PV and is electrically connected to the drain D of the active device T. The gate (or namely gate electrode) G, the channel (or namely channel layer) CH, the source (or namely source electrode) S, the drain (or namely drain electrode) D and the pixel electrode 132 are located on the same side of the substrate 110. In other words, the gate G, the channel CH, the source S, the drain D and the pixel electrode 132 are all located on the first surface 110c of the substrate 110. In the present embodiment, the active device T is, e.g., a transistor, and the transistor is, e.g., a bottom gate transistor. However, the invention is not limited thereto. In other embodiments, the active device T may be a combination of at least one transistor and any other electronic component (e.g., capacitor), and the transistor may be a bottom gate transistor, a top gate transistor or a transistor of any other suitable form.

Referring to FIG. 1, the scan lines $SL_m$ and $SL_{m+1}$ are disposed on the first surface 110c of the substrate 110. Each of the scan lines $SL_m$ and $SL_{m+1}$ is electrically connected to the gate G of the pixel units 130. In the present embodiment, the scan lines $SL_m$ and $SL_{m+1}$ are optionally in the same layer as the gate G of the active device T. However, the invention is not limited thereto. The data lines DL are disposed on the first surface 110c of the substrate 110 and cross over the scan lines $SL_m$ and $SL_{m+1}$. Each data line DL is electrically connected to the source S of the pixel units 130. In the present embodiment, the data line DL is optionally in the same layer as the source S and the drain D of the active device T. However, the invention is not limited thereto. In the present embodiment, the scan lines $SL_m$ and $SL_{m+1}$ and the data line DL are made of metal materials. However, the invention is not limited thereto. In other embodiments, the scan lines $SL_m$ and $SL_{m+1}$ and the data line DL may be made of other conductive materials, e.g., alloys, nitrides of metal materials, oxides of metal materials, nitrogen oxides of metal materials, or stacked layers of metal materials and other conductive materials.

Referring to FIG. 1, the scan driving circuit 140 is disposed in the peripheral area 110b of the substrate 110. The scan driving circuit 140 has at least one shift register $R_n$ or $R_{n+1}$ and at least one bus line BL. FIG. 1 illustrates two shift registers $R_n$ and $R_{n+1}$ and six bus lines BL for exemplary purposes. However, the invention is not limited thereto. The shift registers $R_n$ and $R_{n+1}$ are electrically connected between the bus lines BL and the scan lines $SL_m$ and $SL_{m+1}$. The bus lines BL are configured to receive corresponding initial signals (e.g., a synchronization signal, or a clock signal, etc.). The shift register $R_n$ receives one of the initial signals from one of the bus lines BL, and then converts the initial signal into a driving signal corresponding to the scan line $SL_m$ and generates a pushing signal to be transmitted to the shift register $R_{n+1}$ at the next level, and by repetition of this operation, all the scan lines $SL_m$, $SL_{m+1}$, . . . , and so on (two scan lines are denoted in FIG. 2 for exemplary purposes, but the invention is not limited thereto) are driven. The above n and m are positive integers greater than or equal to 1. Referring to FIG. 2, manufacturing processes of the scan driving circuit 140 and the pixel unit 130 are integrated. For example, a gate G3, a channel CH3, a source S3 and a drain D3 of an active device T3 of the scan driving circuit 140 are manufactured with and are in the same layer as the gate G, the channel CH, the source S and the drain D respectively of the active device T of the pixel unit 130. The scan driving circuit 140 is a so-called gate driver on array (GOA) circuit.

Referring to FIGS. 1 and 2, at least one of the bus lines BL is located on the second surface 110d of the substrate 110. The at least one of the bus lines BL located on the second surface 110d is electrically connected to a corresponding scan line $SL_m$ by at least one conductor 120. In other words, by use of the conductor 120 that penetrates the substrate 110, some components of the scan driving circuit 140 may be disposed on the first surface 110c while other components of the scan driving circuit 140 may be disposed on the second surface 110d. In this way, an orthogonal projection area of the entire scan driving circuit 140 on the first surface 110c is reduced. That is, a width W (denoted in FIG. 1) of the peripheral area 110b is reduced, which contributes to realization of an ultra-slim border in a display panel that adopts the pixel array substrate 100.

Referring to FIG. 1, for example, in the present embodiment, all the shift registers $R_n$ and $R_{n+1}$ are disposed on the first surface 110c of the substrate 110, and all the bus lines BL are disposed on the second surface 110d of the substrate 110. As shown in FIG. 2, the insulation layer PV covers over the bus lines BL so as to protect them. However, the invention is not limited thereto. Referring to FIGS. 1 and 2, the bus lines BL located on the second surface 110d are electrically connected to the shift registers $R_n$ and $R_{n+1}$ located on the first surface 110c by the conductors 120. Then, the shift registers $R_n$ and $R_{n+1}$ are electrically connected to the corresponding scan lines $SL_m$ and $SL_{m+1}$. Compared to a conventional pixel array substrate in which the entire scan driving circuit is disposed on the same surface of the substrate, the width W (denoted in FIG. 1) of the peripheral area 110b of the pixel array substrate 100 in the present embodiment is reduced 10% or more, thus enabling the display panel that adopts the pixel array substrate 100 to easily realize an ultra-slim border. In addition, since at least one of the bus lines BL is disposed on the second surface 110d of the substrate 110, a distance between the bus line BL located on the second surface 110d and any other component (e.g., the shift register $R_n$) of the scan driving circuit 140 is greater than that in the case where both are located on the same surface (wherein the distance at least exceeds a thickness t of the substrate 110). Accordingly, a coupling capacitance between the bus lines BL and the any other component (e.g., the shift register $R_n$) of the scan driving circuit 140 is small, thus reducing loading of the scan driving circuit 140.

It is to be noted that the manner in which the scan driving circuit of the disclosure is arranged on the substrate is not limited to the above description. In other embodiments, the scan driving circuit may be arranged on the first surface 110c and the second surface 110d of the substrate 110 in other manners and thereby realize a display panel having an ultra-slim border. Hereinafter, an example is described with reference to FIGS. 3 and 4.

Figure 3:
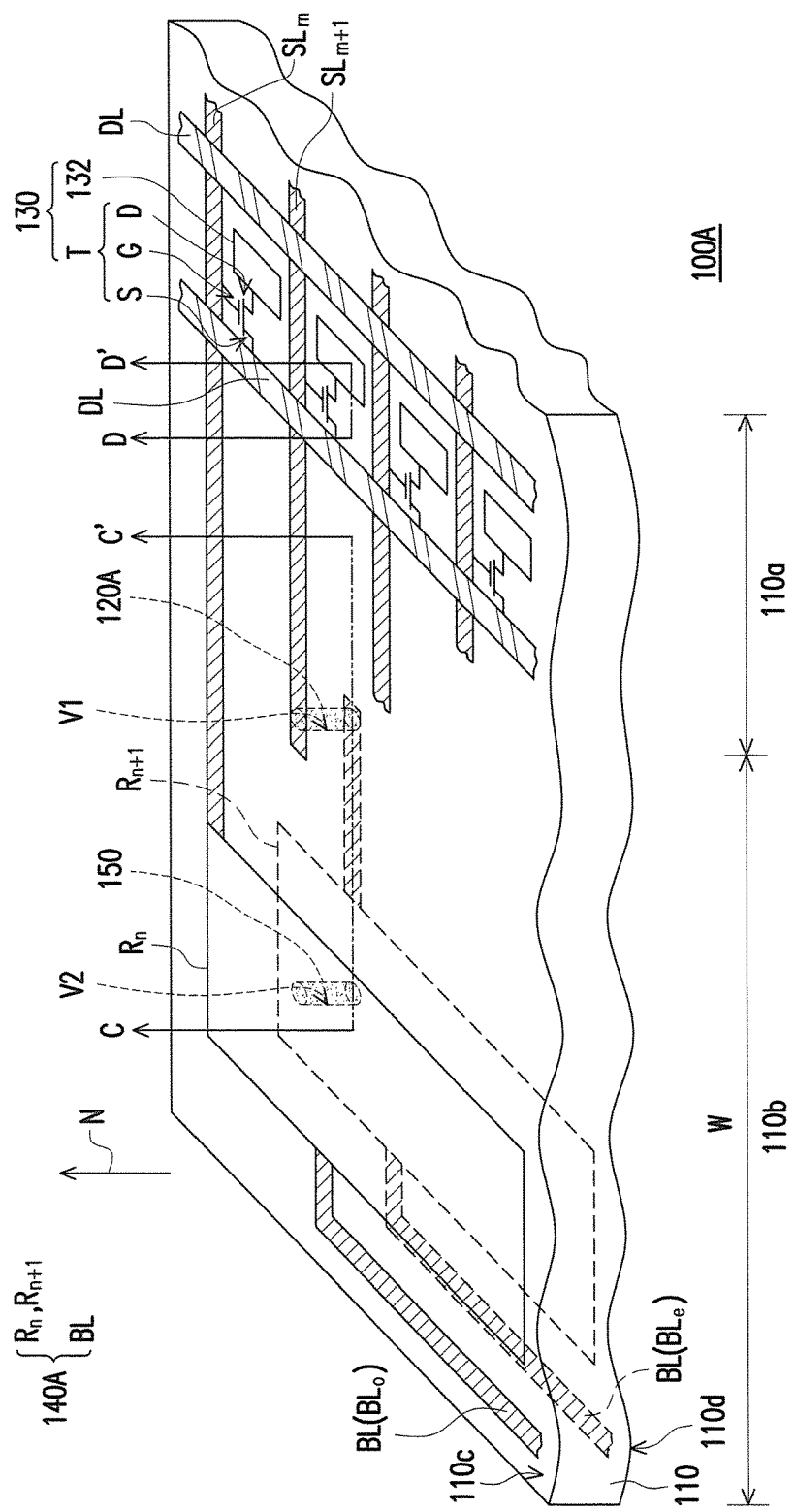
FIG. 3 is a schematic three-dimensional view of a pixel array substrate according to another embodiment of the disclosure.
Figure 4:
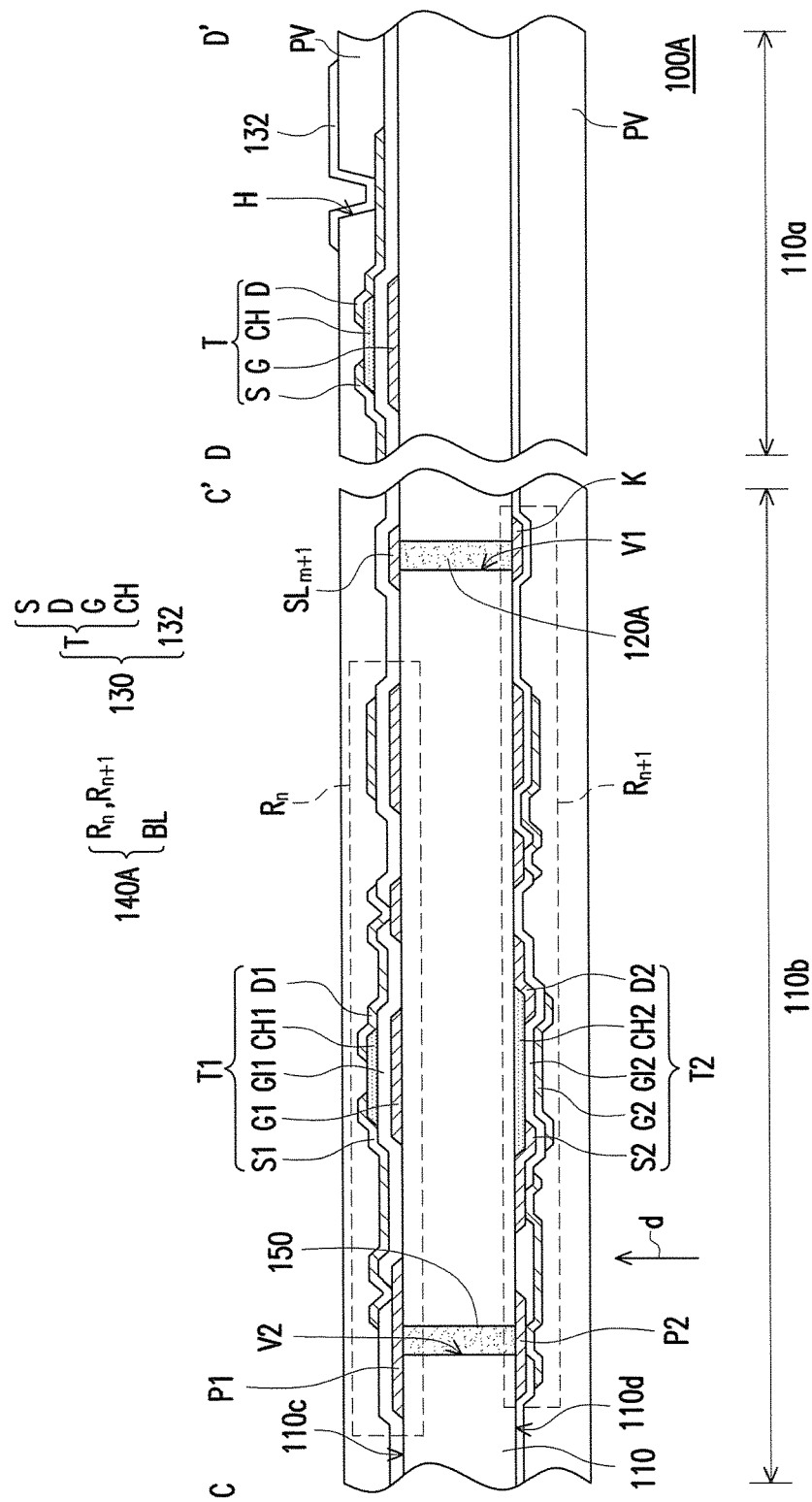
FIG. 4 is a schematic cross-sectional view of a pixel array substrate according to another embodiment of the disclosure.

FIG. 3 is a schematic three-dimensional view of a pixel array substrate according to another embodiment of the disclosure. FIG. 4 is a schematic cross-sectional view of a pixel array substrate according to another embodiment of the disclosure. Particularly, FIG. 4 corresponds to section lines C-C' and D-D' in FIG. 3. A pixel array substrate 100A in FIGS. 3 and 4 is similar to the pixel array substrate 100 in FIGS. 1 and 2. Therefore, the same or corresponding elements are represented by the same or corresponding reference numerals. The pixel array substrate 100A in FIGS. 3 and 4 differs from the pixel array substrate 100 in FIGS. 1 and 2 mainly in that a scan driving circuit 140A of the pixel array substrate 100A is arranged in a manner different from that of the scan driving circuit 140 of the pixel array substrate 100, and that the pixel array substrate 100A further includes a conductor 150 that electrically connects the first shift register $R_n$ and the second shift register $R_{n+1}$ at two adjacent levels. The following mainly describes this difference. The similarities between both pixel array substrates may be obtained by referring to the above description based on the reference numerals in FIGS. 3 and 4, and will not be repeated herein.

Referring to FIG. 3, the pixel array substrate 100A includes the substrate 110, at least one conductor 120A, a plurality of pixel units 130, a plurality of data lines DL, a plurality of scan lines $SL_m$ and $SL_{m+1}$, and a scan driving circuit 140A. The substrate 110 has the display area 110a, the peripheral area 110b outside the display area 110a, the first surface 110c, and the second surface 110d opposite the first surface 110c. At least one via V1 penetrating the first surface 110c and the second surface 110d is disposed in the peripheral area 110b. The at least one conductor 120A is disposed in the at least one via V1.

Referring to FIG. 3, the pixel units 130 are disposed in the display area 110a of the substrate 110 and on the first surface 110c of the substrate 110. Each pixel unit 130 includes the active device T and the pixel electrode 132. Referring to FIG. 4, the active device T has the gate G, the channel CH disposed overlapping the gate G, and the source S and the drain D respectively electrically connected to both sides of the channel CH. The pixel electrode 132 is electrically connected to the drain D of the active device T. The gate G, the channel CH, the source S, the drain D and the pixel electrode 132 are located on the same side of the substrate 110. Referring to FIG. 3, the scan lines $SL_m$ and $SL_{m+1}$ are disposed on the first surface 110c of the substrate 110. Each of the scan lines $SL_m$ and $SL_{m+1}$ is electrically connected to the gate G of the pixel units 130. The data lines DL are disposed on the first surface 110c of the substrate 110 and cross over the scan lines $SL_m$ and $SL_{m+1}$. Each data line DL is electrically connected to the source S of the pixel units 130.

Referring to FIG. 3, the scan driving circuit 140A is disposed in the peripheral area 110b of the substrate 110. The scan driving circuit 140A has the first shift register $R_n$, the second shift register $R_{n+1}$ and the bus lines BL (illustrated in FIG. 3). The first shift register $R_n$ and the second shift register $R_{n+1}$ are electrically connected between the bus lines BL and the scan lines $SL_m$ and $SL_{m+1}$. The bus line BL is configured to receive an initial signal (e.g., a synchronization signal, or a clock signal, etc.). The first shift register $R_n$ receives the initial signal from the bus line BL, and then converts the initial signal into a driving signal corresponding to a m-th scan line $SL_m$ and generates a pushing signal to be transmitted to the second shift register $R_{n+1}$ at the next level, and by repetition of this operation, all the scan lines $SL_m$, $SL_{m+1}$, . . . , and so on are driven. Similar to the scan driving circuit 140 in FIG. 2, manufacturing processes of the scan driving circuit 140A and the pixel unit 130 are also integrated, and the scan driving circuit 140A is also a so-called GOA circuit.

Referring to FIG. 3, in the present embodiment, the bus lines BL are classified as a bus line $BL_o$ or a bus line $BL_e$. The bus line $BL_o$ is electrically connected to the first shift register $R_n$. The bus line $BL_e$ is electrically connected to the second shift register $R_{n+1}$. One (e.g., the bus line $BL_o$) of the bus lines BL is located on the first surface 110c of the substrate 110. The other (e.g., the bus line $BL_e$) of the bus line $BL_o$ is located on the second surface 110d of the substrate 110. The first surface 110c has a normal direction N. The bus line $BL_o$ and the bus line $BL_e$ are optionally aligned with each other in the normal direction N. However, the invention is not limited thereto. In other embodiments, the bus line $BL_e$ and the bus line $BL_o$ may be staggered with respect to each other in the normal direction N which also means that the bus line $BL_e$ and the bus line $BL_o$ partially overlap or don't totally overlap, and this will be described in the later paragraphs with reference to the other drawings.

Referring to FIGS. 3 and 4, at least one bus line BL is located on the second surface 110d of the substrate 110. The bus line BL located on the second surface 110d is electrically connected to a corresponding scan line $SL_{m+1}$ by at least one conductor 120A. For example, in the present embodiment, the bus line $BL_e$ is located on the second surface 110d of the substrate 110. The bus line $BL_e$ located on the second surface 110d is electrically connected to a corresponding scan line $SL_{m+1}$ by at least one conductor 120A. In detail, the bus line $BL_e$ is electrically connected to the second shift register $R_{n+1}$ located on the same second surface 110d. Then, an output signal terminal K of the second shift register $R_{n+1}$ is electrically connected to a corresponding scan line $SL_{m+1}$ by the conductor 120A, so that the at least one bus line BL located on the second surface 110d is electrically connected to the corresponding scan line $SL_{m+1}$ by the conductor 120A.

Referring to FIG. 3, in the pixel array substrate 100A, the bus line $BL_o$ is located on the first surface 110c of the substrate 110, and the bus line $BL_e$ located on the second surface 110d is electrically connected to a corresponding scan line $SL_{m+1}$ by the conductor 120A. In other words, by use of the conductor 120A, some components of the scan driving circuit 140A may be disposed on the first surface 110c while other components of the scan driving circuit 140A may be disposed on the second surface 110d. In this way, an orthogonal projection area of the entire scan driving circuit 140A on the first surface 110c is reduced, thereby reducing the width W of the peripheral area 110b. Specifically, compared to the conventional pixel array substrate in which the entire scan driving circuit is disposed on the same surface of the substrate, the width W of the peripheral area 110b of the pixel array substrate 100A in the present embodiment is reduced 20% or more, thus enabling a display panel that adopts the pixel array substrate 100A to easily realize an ultra-slim border.

Referring to FIG. 3, after receiving the initial signal from the bus line BL, the first shift register $R_n$ not only converts the initial signal into the driving signal corresponding to the m-th scan line $SL_m$ but also generates the pushing signal to be transmitted to the second shift register $R_{n+1}$ at the next level (i.e., the (n+1)th level), and by repetition of this operation, all the scan lines $SL_m$, $SL_{m+1}$, . . . , and so on are driven. Therefore, the first shift register $R_n$ and the second shift register $R_{n+1}$ at two adjacent levels must be electrically connected to each other. Referring to FIGS. 3 and 4, in the present embodiment, since the first shift register $R_n$ and the second shift register $R_{n+1}$ at two adjacent levels are located on the first surface 110c and the second surface 110d respectively of the substrate 110, the pixel array substrate 100A further includes the conductor 150. The conductor 150 is disposed in a via V2 that penetrates the first surface 110c and the second surface 110d, and the first shift register $R_n$ and the second shift register $R_{n+1}$, at two adjacent levels are electrically connected to each other by the conductor 150.

Referring to FIG. 4, in detail, the first shift register $R_n$ includes a first transistor T1. The first transistor T1 includes a first gate G1 disposed on the first surface 110c, a first gate insulation layer GI1 disposed on the first gate G1, a first channel CH1 disposed on the first gate insulation layer GI1, and a first source S1 and a first drain D1 disposed on the first channel CH1. In the present embodiment the first transistor is a bottom gate TFT, but is not limited it. In other embodiments, the first transistor T1 is a top gate TFT. The first source S1 or the first drain D1 is electrically connected to the corresponding bus line BL (illustrated in FIG. 3). Referring to FIGS. 3 and 4, for example, the first source S1 or the first drain D1 of the first shift register $R_n$ is electrically to the bus line $BL_o$. Referring to FIG. 4, the second shift register $R_{n+1}$ includes a second transistor T2. The second transistor T2 includes a second gate G2 disposed on the second surface 110d, a second gate insulation layer GI2 disposed on the second gate G2, a second channel CH2 disposed on the second gate insulation layer GI2, and a second source S2 and a second drain D2 disposed on the second channel CH2. The second source S2 or the second drain D2 is electrically connected to the corresponding bus lines BL. Referring to FIGS. 3 and 4, for example, the second source S2 or the second drain D2 of the second shift register $R_{n+1}$ is electrically to the bus line $BL_e$ at an even-numbered level. Particularly, as shown in FIG. 4, the first transistor T1 of the first shift register $R_n$ and the second transistor T2 of the second shift register $R_{n+1}$ are electrically connected to each other by the conductor 150. More specifically, the first shift register $R_n$ further includes a first signal pad P1 electrically connected to the first transistor T1, and the second shift register $R_{n+1}$ further includes a second signal pad P2 electrically connected to the second transistor T2. The first signal pad P1 is electrically connected to the second signal pad P2 by the conductor 150, so that the first transistor T1 and the second transistor T2 are electrically connected to each other.

It is worth noting that as shown in FIG. 4, the second channel CH2 of the second transistor T2 is located between the second surface 110*d* of the substrate 110 and the second gate G2. In other words, the second transistor T2 may be a top gate transistor (TFT). In other embodiments, when the second transistor T2 can be a bottom gate TFT. In this way, when light (e.g., light emitted from a backlight source) is irradiated on the pixel array substrate 100A along a direction d in which the second surface 110*d* points to the first surface 110*c*, the second gate G2 of the second transistor T2 covers the second channel CH2, so as to reduce photo current leakage of the second transistor T2. On the other hand, the first transistor T1 disposed on the first surface 110*c* may be designed as a bottom gate transistor (TFT), and the first gate G1 is located between the first channel CH1 and the first surface 110*c* of the substrate 110. In this way, when light is irradiated on the pixel array substrate 100A along the direction d, the first gate G1 of the first transistor T1 covers the first channel CH1, so as to reduce photo current leakage of the first transistor T1. In the present embodiment, the first transistor T1 and the second transistor T2 are optionally aligned with each other. However, the invention is not limited thereto. In other embodiments, when the first transistor T1 is a bottom gate TFT, the first transistor T1 and the second transistor T2 may be staggered with respect to each other.

Figure 5:
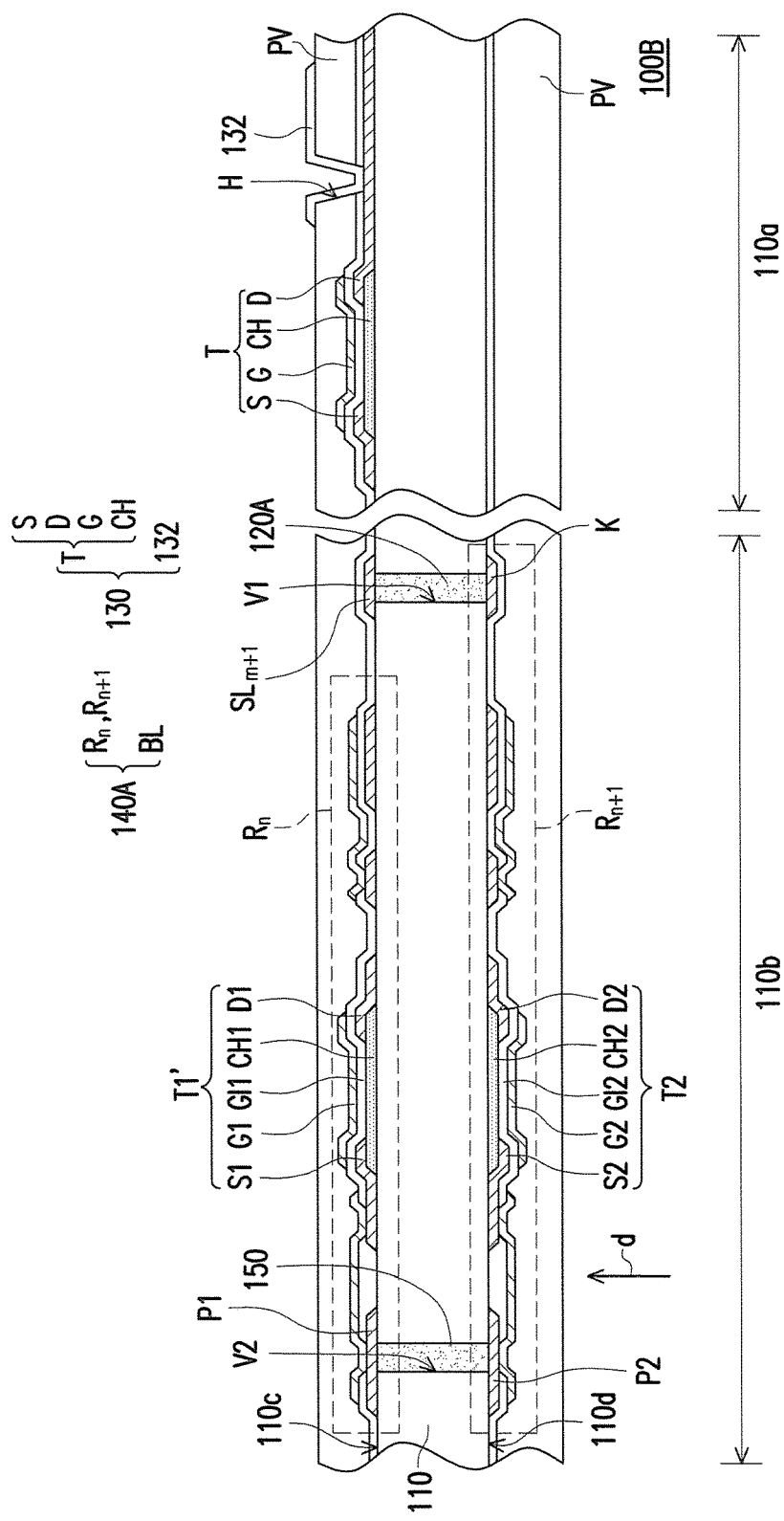
FIG. 5 is a schematic cross-sectional view of a pixel array substrate according to still another embodiment of the disclosure.

It is to be noted that in the disclosure, the first transistor T1 is not necessarily a bottom gate TFT or a top gate TFT, and the first transistor T1 and the second transistor T2 are not necessarily aligned or staggered. Hereinafter, an example is described with reference to FIG. 5. FIG. 5 is a schematic cross-sectional view of a pixel array substrate according to still another embodiment of the invention. A pixel array substrate 100B in FIG. 5 is similar to the pixel array substrate 100A in FIG. 4. Therefore, the same or corresponding elements are represented by the same or corresponding reference numerals. In the embodiment in FIG. 5, a first transistor T1' is optionally a top gate TFT. Preferably, the first transistor T1' is aligned with the second transistor T2, so that the second gate G2 of the second transistor T2 covers the first channel CH1 of the first transistor T1', so as to reduce photo current leakage of the first transistor T1'. However, the invention is not limited thereto.

Figure 6:
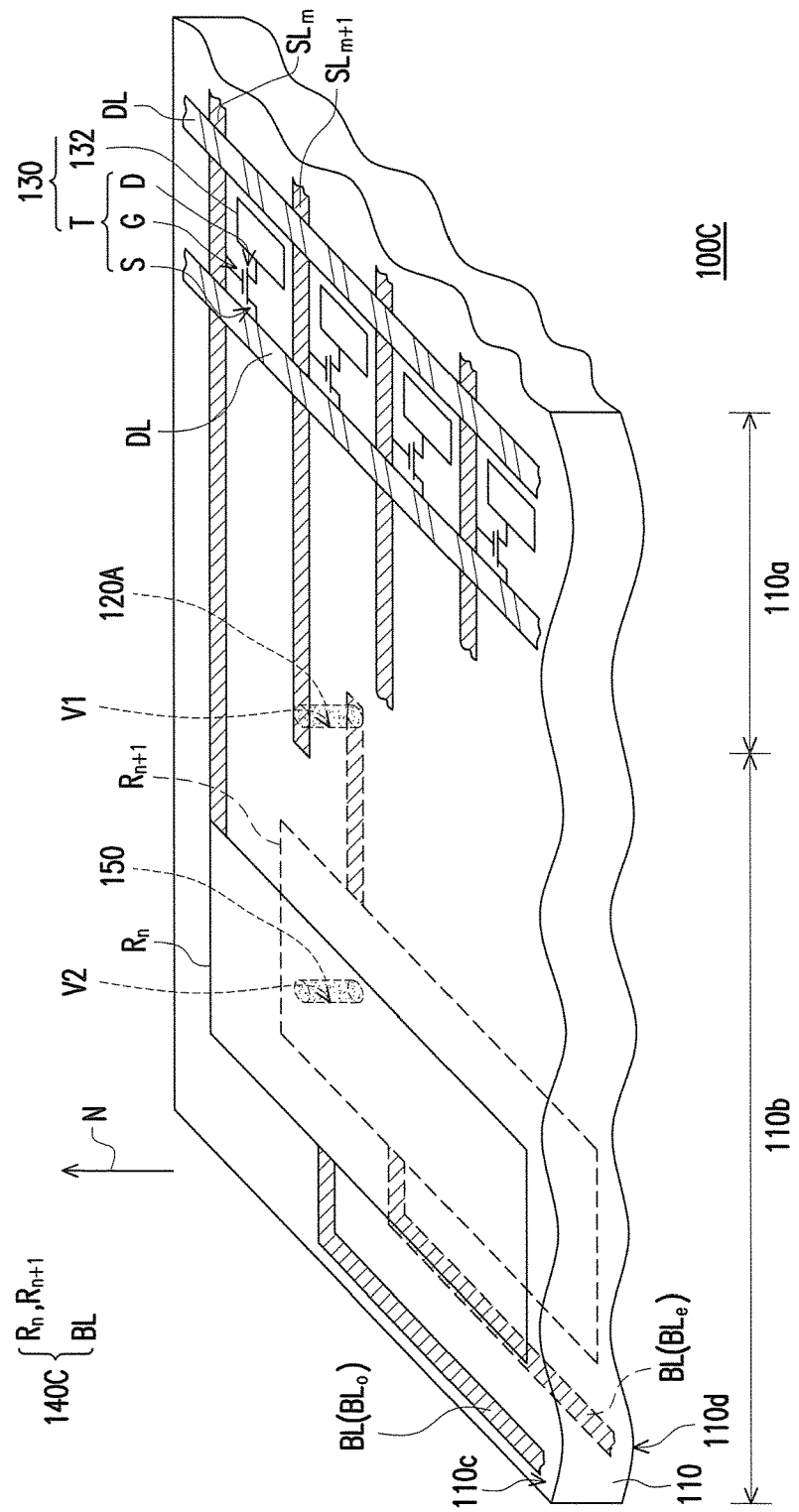
FIG. 6 is a schematic three-dimensional view of a pixel array substrate according to an embodiment of the disclosure.

FIG. 6 is a schematic three-dimensional view of a pixel array substrate according to an embodiment of the invention. A pixel array substrate 100C in FIG. 6 is similar to the pixel array substrate 100A in FIG. 4. Therefore, the same or corresponding elements are represented by the same or corresponding reference numerals. The pixel array substrate 100C differs from the pixel array substrate 100A mainly in that the bus line BL of the pixel array substrate 100C is arranged in a manner different from that of the bus line BL of the pixel array substrate 100A. The following mainly describes this difference. The similarities between both pixel array substrates may be obtained by referring to the above description based on the reference numerals in FIG. 6, and will not be repeated herein.

Referring to FIG. 6, the pixel array substrate 100C includes the substrate 110, at least one conductor 120A, a plurality of pixel units 130, a plurality of data lines DL, a plurality of scan lines $SL_m$ and $SL_{m+1}$, and a scan driving circuit 140C. The substrate 110 has the display area 110*a*, the peripheral area 110*b* outside the display area 110*a*, the first surface 110*c*, and the second surface 110*d* opposite the first surface 110*c*. At least one via V1 penetrating the first surface 110*c* and the second surface 110*d* is disposed in the peripheral area 110*b*. The at least one conductor 120A is disposed in the at least one via V1.

The pixel units 130 are disposed in the display area 110*a* of the substrate 110 and on the first surface 110*c* of the substrate 110. Each pixel unit 130 includes the active device T and the pixel electrode 132. The pixel electrode 132 is electrically connected to the drain D of the active device T. The scan lines $SL_m$ and $SL_{m+1}$ are disposed on the first surface 110*c* of the substrate 110. Each of the scan lines $SL_m$ and $SL_{m+1}$ is electrically connected to the gate G of the pixel units 130. The data lines DL are disposed on the first surface 110*c* of the substrate 110 and cross over the scan lines $SL_m$ and $SL_{m+1}$. Each data line DL is electrically connected to the source S of the pixel units 130. The scan driving circuit 140C is disposed in the peripheral area 110*b* of the substrate 110. The scan driving circuit 140C has a plurality of first shift registers $R_n$, a plurality of second shift registers $R_{n+1}$ and a plurality of bus lines BL. The first shift register $R_n$ and the second shift register $R_{n+1}$ are electrically connected between the bus lines BL and the scan lines $SL_m$ and $SL_{m+1}$.

At least one bus line BL is located on the second surface 110*d* of the substrate 110. The bus line BL located on the second surface 110*d* is electrically connected to a corresponding scan line $SL_{m+1}$ by at least one conductor 120A. For example, in the embodiment in FIG. 6, the bus line BL is classified as the bus line $BL_o$ or the bus line $BL_e$. The bus line $BL_o$ is located on the first surface 110*c* of the substrate 110. The bus line $BL_e$ is located on the second surface 110*d* of the substrate 110. The bus line $BL_e$ located on the second surface 110*d* is electrically connected to a corresponding scan line $SL_{m+1}$ by the conductor 120A. Different from the pixel array substrate 100A in FIG. 3, in the pixel array substrate 100C, the bus line $BL_o$ and the bus line $BL_e$ may be staggered with respect to each other in the normal direction N which also means that the bus line $BL_e$ and the bus line $BL_o$ partially overlap or don't totally overlap. In this way, a distance between the bus line $BL_o$ and the bus line $BL_e$ is increased, so that a coupling capacitance between the bus line $BL_o$ and the bus line $BL_e$ is reduced, thereby further reducing loading of the scan driving circuit 140C. In addition, the pixel array substrate 100C has similar effects and advantages as the pixel array substrate 100A, which will not be repeated herein.

In summary, in the pixel array substrate according to an embodiment of the invention, at least one bus line is located on the second surface of the substrate, and the bus line is electrically connected to the corresponding scan line by the conductor that passes through the first surface and the second surface of the substrate. In other words, by use of the conductor that penetrates the substrate, some components of the scan driving circuit may be disposed on the first surface of the substrate while other components of the scan driving circuit may be disposed on the second surface of the substrate. In this way, the orthogonal projection area of the entire scan driving circuit on the substrate surface is reduced. That is, the width of the peripheral area of the pixel array substrate is reduced, which contributes to realization of an ultra-slim border in a display panel that adopts the pixel array substrate.

Although the invention has been described with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A pixel array substrate, comprising:
   a substrate having a first surface, a second surface and at least one via, wherein the first surface and the second surface are opposite each other, and the at least one via penetrates the first surface and the second surface;
   at least one conductor disposed in the at least one via;
   a plurality of pixel units disposed on the first surface, wherein at least one of the pixel units comprises:
      an active device having a gate, a channel disposed overlapping the gate, and a source and a drain respectively electrically connected to both sides of the channel; and
      a pixel electrode electrically connected to the drain;
   a plurality of data lines disposed on the first surface, and the pixel units are electrically connected to one of the data lines;
   a plurality of scan lines disposed on the first surface, and the pixel units are electrically connected to one of the scan lines;
   at least one shift register located on the first surface and configured to transmit a first gate signal to corresponding one of the scan lines; and
   at least one bus line electrically connected to the at least one shift register by the at least one conductor.

2. The pixel array substrate according to claim 1, wherein the at least one conductor is a plurality of conductors, and the at least one shift register further comprises:
   a first shift register located on the first surface; and
   a second shift register located on the second surface;
   wherein the first shift register is electrically connected to the second shift register by one of the conductors, and the first shift register and the second shift register overlap in a normal direction;
   the scan lines comprise:
   a plurality of first scan lines electrically connected to the first shift register and configured to receive the first gate signal provided by the first shift register; and
   a plurality of second scan lines electrically connected to the second shift register and configured to receive a second gate signal provided by the second shift register;
   wherein the first scan lines and the second scan lines are arranged alternately.

3. The pixel array substrate according to claim 2, wherein the second shift register is electrically connected to the second scan lines by another one of the conductors.

4. The pixel array substrate according to claim 2, wherein the at least one bus line further comprises:
   a plurality of first bus lines located on the first surface and electrically connected to the first scan lines by the first shift register; and
   a plurality of second bus lines located on the second surface and electrically connected to the second scan lines by the second shift register, wherein the first bus lines and the second bus lines are aligned in the normal direction.

5. The pixel array substrate according to claim 2, wherein the first shift register and the second shift register respectively have a first transistor and a second transistor, the second transistor is electrically connected to the first transistor by another one of the conductors, and the first transistor comprises:
   a first gate disposed on the first surface;
   a first gate insulation layer disposed on the first gate;
   a first channel disposed on the first gate insulation layer;
   a first source and a first drain, disposed on the first channel, and the first source or the first drain is electrically connected to the at least one bus line.

6. The pixel array substrate according to claim 5, wherein the second transistor comprises:
   a second channel disposed on the second surface;
   a second source and a second drain, disposed on a side of the second channel away from the substrate, and the second source or the second drain is electrically connected to the at least one bus line;
   a second gate insulation layer covering the second channel, the second source, the second drain and the second surface; and
   a second gate disposed on a side of the second gate insulation layer away from the second channel, wherein the second channel is located between the second surface of the substrate and the second gate.

7. The pixel array substrate according to claim 6, wherein the first gate is located between the first channel and the first surface of the substrate.

8. A pixel array substrate, comprising:
   a substrate having a first surface, a second surface and at least one via, wherein the first surface and the second surface are opposite each other, and the at least one via penetrates the first surface and the second surface;
   at least one conductor disposed in the at least one via;
   a plurality of pixel units disposed in a display area and on the first surface, wherein each of the pixel units comprises:
      an active device having a gate, a channel disposed overlapping the gate, and a source and a drain respectively electrically connected to both sides of the channel; and
      a pixel electrode electrically connected to the drain, wherein the gate, the channel, the source, the drain and the pixel electrode are located on the same side of the substrate;
   a plurality of data lines disposed on the first surface, and the pixel units are electrically connected to one of the data lines; and
   a plurality of scan lines disposed on the first surface, and the pixel units are electrically connected to one of the scan lines;
   a first shift register located on the first surface and configured to transmit a first gate signal to corresponding one of the scan lines; and
   a second shift register located on the second surface and configured to transmit a second gate signal to corresponding one of the scan lines, wherein
      the first shift register and the second shift register respectively have a first transistor and a second transistor, the second transistor is electrically connected to the first transistor by the at least one conductor, and the first transistor comprises a first gate, a first gate insulation layer, a first channel, a first source and a first drain, wherein the first gate insulation layer disposed between the first gate and the first channel, and the first source and the first drain contact the first channel, and the second transistor comprises a second gate, a second gate insulation layer, a second channel, a second source and a second drain, wherein the second gate insulation layer disposed between the second gate and the second channel, and the second source and the second drain contact the second channel, wherein the first transistor disposed on the first surface of the substrate, and the second transistor disposed on the second surface of the substrate.

9. The pixel array substrate according to claim 8, wherein the first gate is located between the first channel and the first surface of the substrate.

10. The pixel array substrate according to claim 8, wherein the second channel is located between the second surface of the substrate and the second gate.

\* \* \* \* \*